(12) United States Patent
Wong et al.

(10) Patent No.: US 7,381,600 B2
(45) Date of Patent: Jun. 3, 2008

(54) METHOD OF ANNEALING POLYCRYSTALLINE SILICON USING SOLID-STATE LASER AND DEVICES BUILT THEREON

(75) Inventors: Man Wong, Hong Kong (CN); Hoi Sing Kwok, Hong Kong (CN); Zhiguo Meng, Hong Kong (CN)

(73) Assignee: The Hong Kong University of Science and Technology, Hong Kong SAR (CN)

( * ) Notice: Subject to any disclaimer, the term of this patent is extended or adjusted under 35 U.S.C. 154(b) by 432 days.

(21) Appl. No.: 11/292,257

(22) Filed: Dec. 1, 2005

(65) Prior Publication Data

US 2006/0148217 A1    Jul. 6, 2006

Related U.S. Application Data

(60) Provisional application No. 60/632,190, filed on Dec. 2, 2004.

(51) Int. Cl.
*H01L 21/324* (2006.01)
*H01L 21/477* (2006.01)

(52) U.S. Cl. ....................... 438/166; 438/487
(58) Field of Classification Search ................ 438/166, 438/487
See application file for complete search history.

(56) References Cited

U.S. PATENT DOCUMENTS

| 5,275,851 | A | 1/1994 | Fonash et al. | 438/479 |
|---|---|---|---|---|
| 5,352,291 | A | 10/1994 | Zhang et al. | 117/8 |
| 5,705,829 | A | 1/1998 | Miyanaga et al. | 257/66 |
| 5,854,096 | A * | 12/1998 | Ohtani et al. | 438/166 |
| 5,869,362 | A | 2/1999 | Ohtani | 438/166 |
| 5,879,977 | A | 3/1999 | Zhang et al. | 438/166 |
| 5,893,730 | A | 4/1999 | Yamazaki et al. | 438/166 |
| 6,071,796 | A | 6/2000 | Voutsas | 438/487 |
| 6,319,761 | B1 * | 11/2001 | Zhang et al. | 438/166 |
| 6,537,864 | B1 | 3/2003 | Aya et al. | 438/166 |
| 6,737,674 | B2 | 5/2004 | Zhang et al. | 257/64 |
| 7,132,375 | B2 * | 11/2006 | Yamazaki | 438/795 |
| 7,135,389 | B2 * | 11/2006 | Yamazaki et al. | 438/487 |
| 7,214,574 | B2 * | 5/2007 | Yamazaki et al. | 438/166 |
| 7,332,431 | B2 * | 2/2008 | Maekawa | 438/674 |
| 2001/0018224 | A1 | 8/2001 | Zhang | 438/30 |
| 2003/0129853 | A1 | 7/2003 | Nakajima et al. | 438/795 |
| 2004/0069751 | A1 * | 4/2004 | Yamazaki et al. | 219/121.6 |
| 2004/0087116 | A1 | 5/2004 | Nakayama | 438/487 |
| 2004/0087156 | A1 * | 5/2004 | Maekawa | 438/689 |
| 2006/0141688 | A1 * | 6/2006 | Kusumoto et al. | 438/161 |
| 2007/0184590 | A1 * | 8/2007 | Tanaka et al. | 438/166 |

* cited by examiner

*Primary Examiner*—M. Wilczewski
(74) *Attorney, Agent, or Firm*—Heslin Rothenberg Farley & Mesiti P.C.

(57) ABSTRACT

The invention provides a method of forming polycrystalline silicon comprising the steps of: forming a layer of amorphous silicon, forming a layer of metal or metal-containing compound on the layer of amorphous silicon, annealing the layer of amorphous silicon and said layer of metal to form a polycrystalline silicon layer, and irradiating the polycrystalline silicon layer with two different harmonics of a pulsed laser. The pulsed laser is preferably a solid-state laser such as a Nd-Yag laser. One harmonic is chosen such that it is preferentially absorbed by defects in the polycrystalline silicon layer, the other harmonic is absorbed by the bulk polycrystalline silicon.

26 Claims, 7 Drawing Sheets

METHOD OF ANNEALING POLYCRYSTALLINE SILICON USING SOLID-STATE LASER AND DEVICES BUILT THEREON

CROSS-REFERENCE TO RELATED APPLICATION

This application claims priority from U.S. Provisional Application 60/632,190 filed Dec. 2, 2004, the entire disclosure of which is incorporated herein by reference.

FIELD OF THE INVENTION

This invention relates to a method of forming polycrystalline silicon for use in the fabrication of semiconductor devices, and in particular to a method using laser induced annealing of metal-induced polycrystalline silicon.

BACKGROUND OF THE INVENTION

Thin-film transistors (TFTs) are used in the construction of active-matrix liquid-crystal displays, active-matrix organic light emitting diode displays, active-matrix e-ink electronic books and active-matrix image sensors. TFTs based on amorphous silicon suffer from low operating speed and lack of a p-type device, making it difficult to realize peripheral circuits. There has therefore been a move to polycrystalline silicon devices, which can be obtained from amorphous silicon by furnace or laser-induced heating.

Among the important requirements for the realization of thin-film semiconductor devices are (a) quality, (b) uniformity and reproducibility, (c) maximum fabrication process temperature and (4) manufacturing cost. Polycrystalline silicon can be obtained by metal-induced crystallization of amorphous silicon at a temperature below 550° C. using low-cost conventional furnaces. The resulting material contains large grains with continuous grain boundaries, and uniform and reproducible material and device characteristics. However, better material and device performance is possible if material micro-defects can be reduced.

Excimer laser crystallization of amorphous silicon can be utilized to produce good quality polycrystalline silicon. However, the quality is not uniform and suffers from poor reproducibility. The cost is also high.

Polycrystalline silicon obtained by conventional low-pressure chemical vapor deposition suffers from high process temperature (620-650° C.) and poor material quality. The quality can be improved using high temperature annealing (above 900° C.). However, this is only possible with the much more expensive quartz substrates and not with inexpensive glass substrates.

An alternative technique of obtaining polycrystalline silicon is metal-induced crystallization (U.S. Pat. Nos. 5,275, 851; 5,879,977; 6,737,674; and U.S. Patent Publication 2001/018224). The resulting material contains large grains with continuous grain boundaries, and uniform and reproducible material and device characteristics. However, improved material and device performance is still possible if material micro-defects can be reduced.

Another technique is excimer laser crystallization of amorphous silicon, which can be utilized to produce good quality polycrystalline silicon (U.S. Pat. Nos. 5,352,291; 6,071,796; and U.S. Patent Publication 2004/087116). However, the resulting quality is not uniform and suffers from poor reproducibility. The cost is also high.

Combining metal-induced crystallization and excimer laser annealing has been proposed in U.S. Pat. Nos. 5,705, 829; 5,893,730; 5,869,362; and U.S. Patent Publication 2003/129853). However, the excimer laser is expensive and complex. Polycrystalline silicon can be obtained using Nd:YAG laser heated conductor layer on amorphous silicon (U.S. Pat. No. 6,537,864). While the laser is relatively inexpensive, this technique suffers from high effective process temperature and the quality of the resulting material is less than adequate.

SUMMARY OF THE INVENTION

According to the present invention there is provided a method of forming polycrystalline silicon comprising the steps of: forming a layer of amorphous silicon, forming a layer of metal or metal-containing compound on said layer of amorphous silicon, annealing said layer of amorphous silicon and said layer of metal to form a polycrystalline silicon layer, and irradiating the polycrystalline silicon layer with two different harmonics of a pulsed laser.

The polycrystalline silicon layer may be irradiated with the two harmonics simultaneously in a single pulse, wherein said pulse has a typical duration of from 1 ns to 10 ms, preferably from 5 to 30 ns and a typical power of from 30-300 mJ/cm$^2$, or alternatively the polycrystalline silicon layer may be irradiated with the two harmonics sequentially.

Preferably the two harmonics are the second and third harmonics of a pulsed laser having an emission wavelength of between 0.9 and 1.2 microns. A suitable laser, for example, may be a solid-state laser.

Preferably the annealing of the amorphous silicon layer and the metal or metal-containing layer is carried out at a temperature of from 400 to 650° C. for a duration of from 0.5 to 5 hours.

According to the present invention there is also provided a method of fabricating a semiconductor device comprising: forming a layer of amorphous silicon on a substrate, forming a layer of metal or metal-containing compound on said layer of amorphous silicon, annealing said layer of amorphous silicon and said layer of metal to form a polycrystalline silicon layer, and irradiating the polycrystalline silicon layer with two different harmonics of a pulsed laser.

BRIEF DESCRIPTION OF THE DRAWINGS

Some embodiments of the invention will now be described by way of example and with reference to the accompanying drawings, in which.

DETAILED DESCRIPTION OF PREFERRED EMBODIMENTS

Some methods of fabricating semiconductor device using solid-state laser annealed polycrystalline silicon formed using metal-induced crystallization in accordance with embodiments of the invention will now be described with reference to FIGS. 1 to 9.

The present invention at least in its preferred forms teaches a technique of forming polycrystalline silicon thin films by combining the processes of metal-induced crystallization of amorphous silicon and solid-state laser based annealing. The resulting quality of the films is good, uniform and reproducible. Semiconductor devices can be built on the films with a maximum temperature not exceeding 550° C. The cost of solid-state lasers is typically low. A first important aspect of the present invention is the utilization of inexpensive solid-state lasers to reduce the population of material micro-defects in polycrystalline silicon formed using metal-induced crystallization. A second important aspect is the utilization of higher harmonics of solid-state lasers. In the case of a Nd:YAG laser, the third harmonic at 355 nm is quite readily absorbed by silicon while the second harmonic at 532 nm is preferentially absorbed by the microdefects. The former is useful in reducing bulk defects while the latter is useful in reducing localized grain boundary defects.

The resulting polycrystalline silicon can be used in a variety of applications, including but not limited to sensors, electronic devices, flat-panel displays and three-dimensional integrated circuits.

Figure 1:
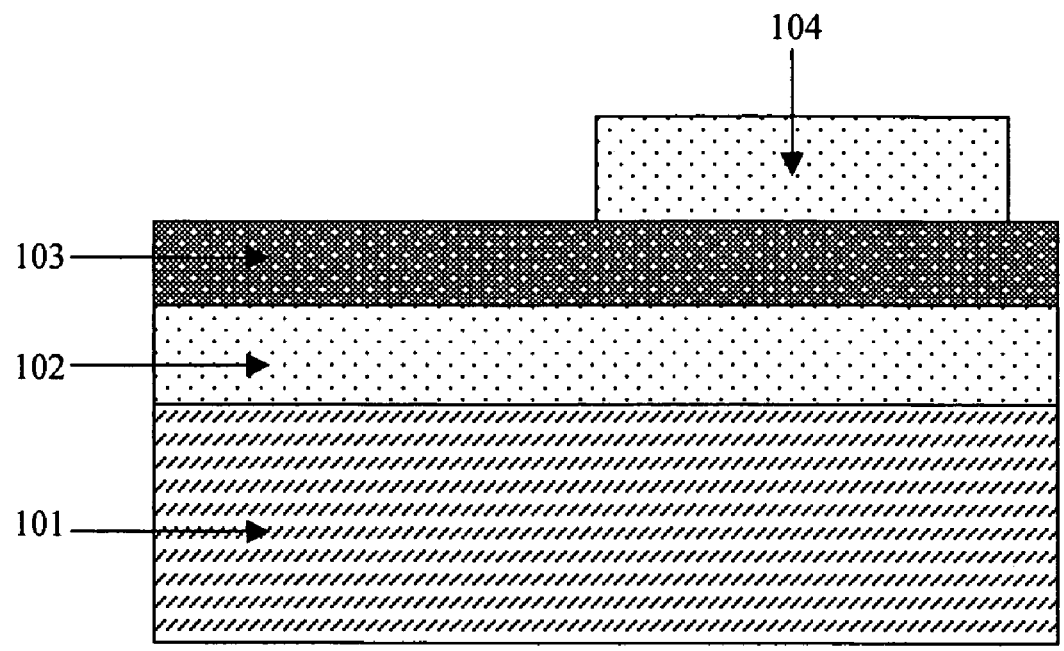
FIG. 1 shows a schematic cross-section of amorphous silicon film deposited on insulator-covered substrate with a mask defined selected and non-selected regions.

Shown in FIG. 1 is the schematic cross-section comprising an amorphous silicon film 103 deposited on an insulator 102 that covers substrate 101. A masking layer 104 is deposited on a desired region of the amorphous silicon film 103. The substrate may be formed of any suitable material such as high temperature polymer, glass, stainless steel, polycrystalline silicon or single-crystal silicon optionally containing pre-fabricated conventional integrated circuits. The insulator layer 102 is capable of withstanding process temperatures above 650° C. for an extended period of time and acts as a buffer layer. Suitable materials for this buffer layer include silicon oxide, silicon oxynitride or silicon nitride but other materials are also possible.

The amorphous silicon film 103 is preferably from 10 nm to 3 μm thick and can be formed at a low temperature between 150° C. to 600° C., using a variety of techniques including but not limited to sputtering, evaporation or low pressure thermal and plasma enhanced chemical vapor deposition. After forming the amorphous silicon film 103, a 100 nm to 200 nm thick mask layer 104, which can be (but is not limited to) silicon oxide, silicon oxynitride or silicon nitride, is formed. This layer is capable of withstanding process temperatures above 650° C. for an extended period of time.

Figure 2:
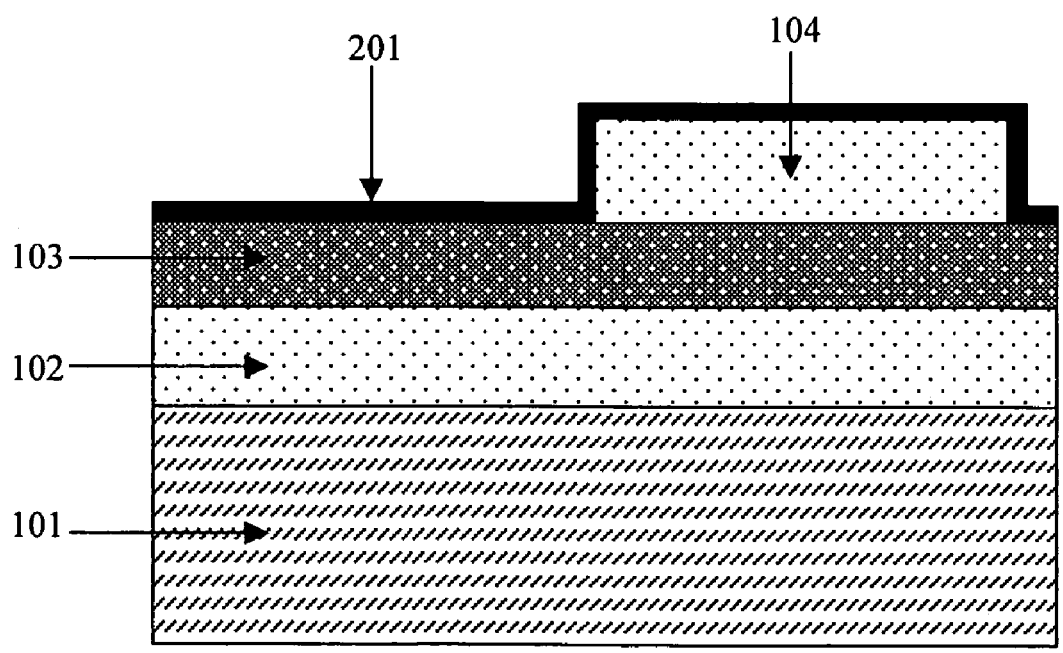
FIG. 2 shows a schematic cross-section in which a layer if nickel has been deposited over the amorphous silicon film of FIG. 1.
Figure 3:
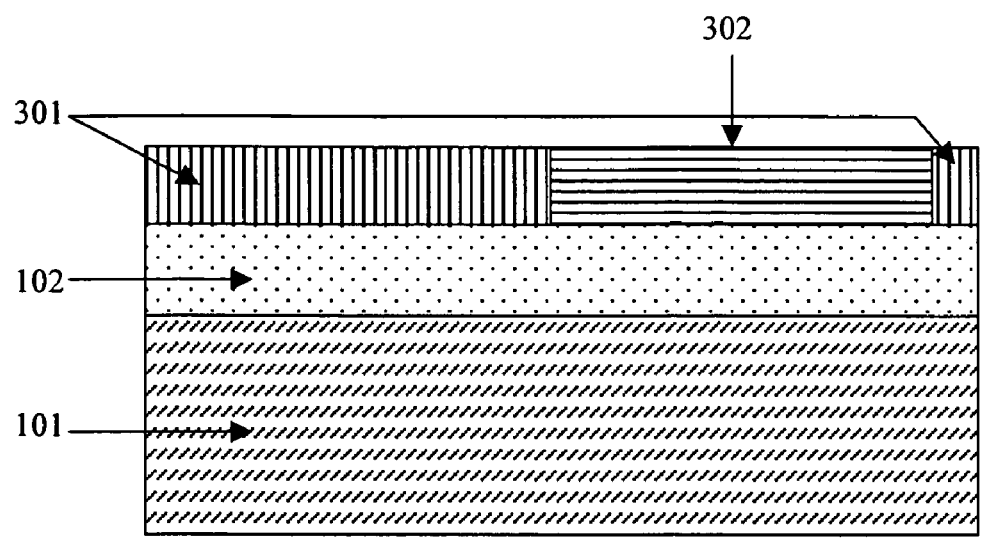
FIG. 3 shows the formation of vertical and lateral metal induced crystallization polycrystalline silicon.
Figure 4:
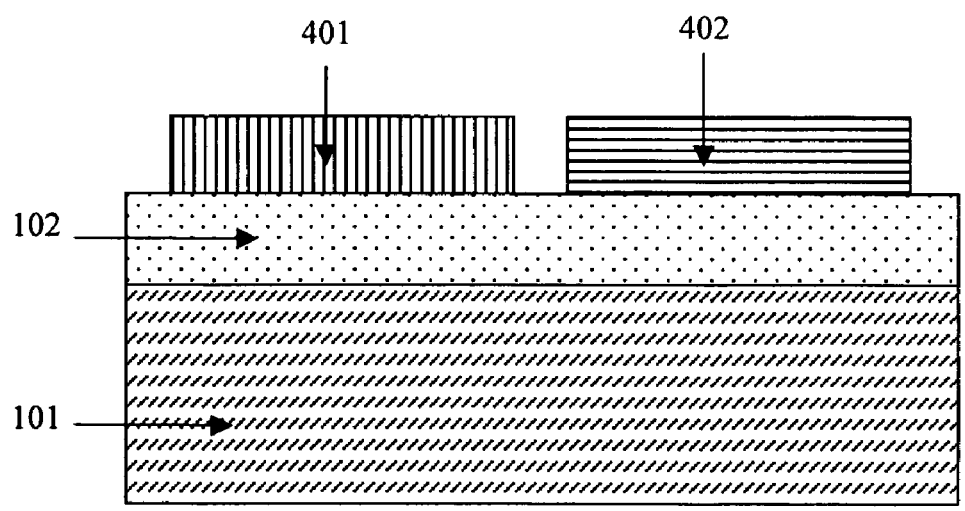
FIG. 4 shows the formation of polysilicon islands on the substrate.

As is shown in FIG. 2 a layer 201 of a metal such as nickel is deposited on exposed regions of amorphous silicon film 103. The nickel layer may have a thickness of between 1-10 nm. The methods of forming the nickel layer 201 include electron-beam evaporation, sputtering, chemical vapor deposition, ion implantation or immersing the substrate in a solution containing nickel ions. Nickel is a particularly preferred metal for inducing crystallization and may be provided as elemental nickel or by means of a nickel-containing compound. Although less preferred compared with nickel other possible metals for inducing crystallization include Fe, Co, Ru, Rh, Pd, Os, Ir, Pt, Cu and Au. After forming the metal layer 201, polycrystalline silicon may then be formed by metal-induced crystallization of amorphous silicon at a temperature between 400° C. and 650° C. in a conventional furnace with an inert ambient atmosphere for between 0.5 and 5 hours. Referring to FIG. 3, region 301 which corresponds to the region of the amorphous silicon directly under the nickel layer 201 is "vertically" crystallized, while region 302, which is the region of the amorphous silicon that was covered by masking layer 104, is laterally crystallized. After the crystallization process, any excess nickel remaining is removed together with the masking layer. Active polycrystalline silicon islands are then defined using conventional photolithography and etching processes. Shown in FIG. 4 is a schematic cross-section of polycrystalline silicon active islands 401 and 402 formed respectively from regions 301 and 302.

Figure 5:
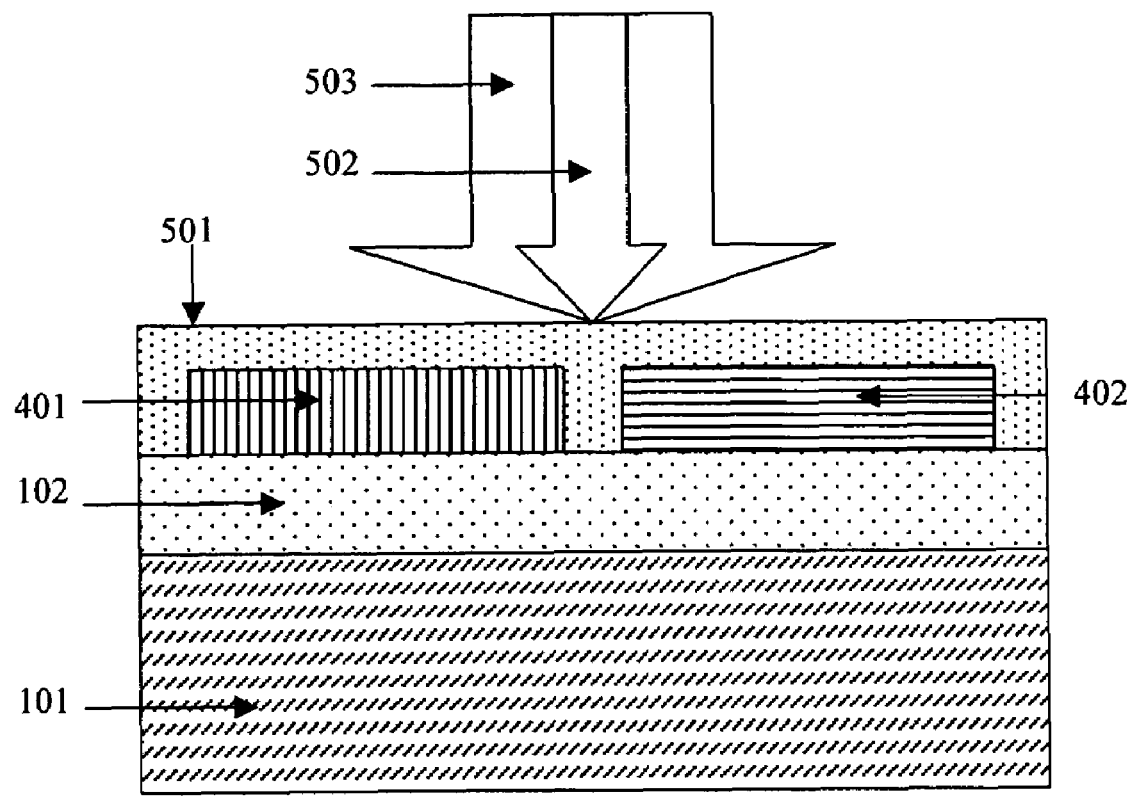
FIG. 5 shows the polycrystalline silicon being irradiated by means of a solid-state laser according to a first embodiment of the invention.

A layer of insulator 501, which can be (but is not limited to) silicon oxide, silicon oxynitride or silicon nitride, is then formed and as is shown schematically in FIG. 5 this insulator layer 501 covers both the islands 401,402 and also the remaining exposed regions of the amorphous silicon layer 102. Through this layer 501, the active islands 401 and 402 are irradiated with single- or mixed-mode solid-state lasers. In this embodiment the active islands are irradiated simultaneously by different harmonics of the laser radiation. In particular the laser is preferably a Nd-Yag solid-state laser producing radiation at 1064 nm. The output of the laser is put through a harmonics crystal change means that is capable of selecting a particular harmonic, and preferably two harmonics 502,503 are chosen and applied to the active islands simultaneously. For example, a single laser pulse may be split by a beamsplitter and sent to two different harmonic changing crystals, one selecting the $m^{th}$ harmonic 502 and the other the $n^{th}$ harmonic 503. In particular if the laser source is a Nd-Yag 1064 nm laser preferably the $2^{nd}$ and $3^{rd}$ harmonics are chosen at wavelengths respectively of 532 nm and 355 nm.

It is an important aspect of the present invention that two different harmonics of the laser radiation are selected and applied since the two different harmonics may have different effects on the device fabrication process. In particular, for example, in the case of the $2^{nd}$ and $3^{rd}$ harmonics of a Nd-Yag laser, the third harmonic at 355 nm is readily absorbed by the silicon, while the second harmonic at 532 nm is preferentially absorbed by the microdefects. The former assists in reducing bulk defects, while the latter is useful in reducing localized grain boundary defects. Different harmonics of the laser can therefore be selected for different purposes.

Preferably a single pulse of a duration between 1 ns and 10 ms, or preferably 5-30 ns, and a power of between 30-300 mJ/cm$^2$ is used. A single pulse of about 100 mJ/cm$^2$ may be used for example.

In addition to an Nd-Yag laser, other lasers may be used such as for example, Nd-glass lasers and Alexandrite lasers.

Figure 6:
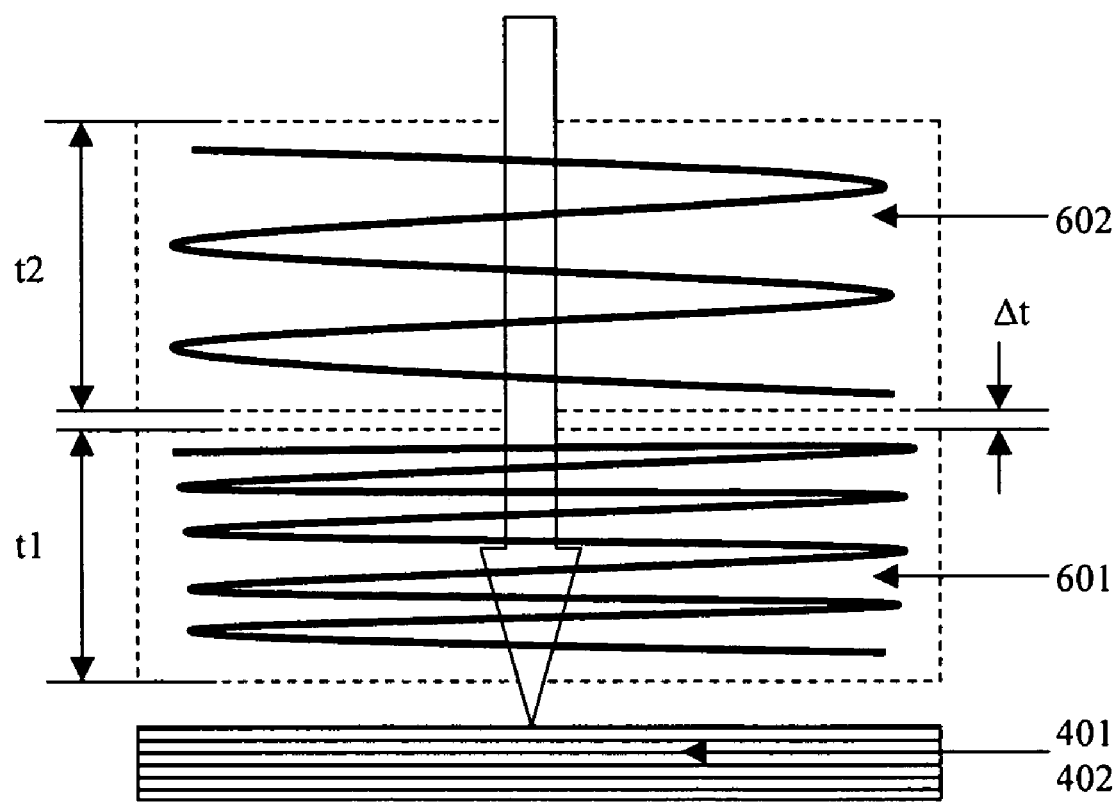
FIG. 6 shows the polycrystalline silicon being irradiated by means of a solid-state laser according to a second embodiment of the invention.

In another embodiment, shown in FIG. 6, instead of simultaneously applying the two harmonics, the two harmonics may be applied. In this manner the duration of exposure, wavelength and power of each mode are separately optimized. In the embodiment of FIG. 6 a first laser irradiation is performed for a time t1 at a first frequency corresponding for example to the third harmonic of a Nd-Yag 1064 nm laser at 355 nm, and then after a short interval Δt a second laser irradiation is performed for a time t2 using the second harmonic of a Nd-Yag 1064 nm laser at 532 nm.

Figure 7:
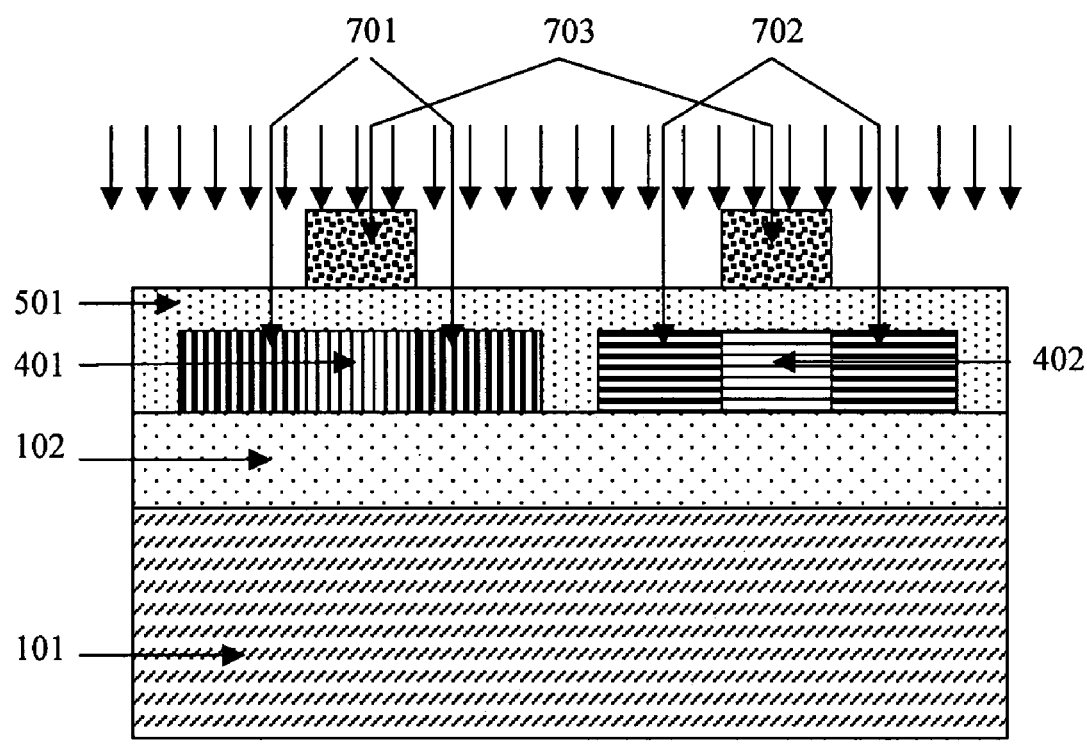
FIG. 7 shows the formation of the gate electrodes and ion implantation in source and drain regions of thin film transistors according to an embodiment of the invention.
Figure 8:
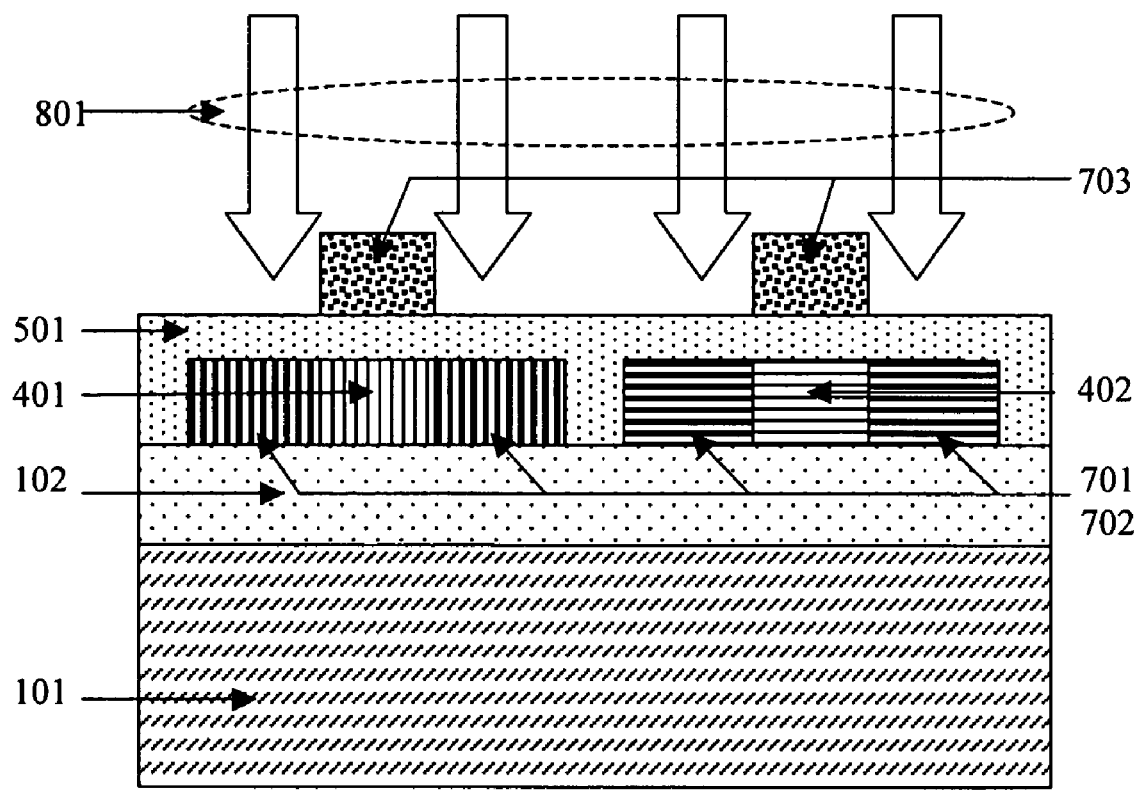
FIG. 8 shows the activation by thermal annealing or Nd:YAG third harmonic laser harmonic of doped source/drain regions.

FIG. 7 shows a schematic cross section of a thin-film transistors formed on active islands 401 and 402. The gate electrodes are indicated by 703. The source/drain regions on active islands 401 and 402 are denoted respectively by 701 and 702. The formation of the gate electrodes and the source/drain ergions may be performed by any conventional manner, and the ion implantation is illustrated by the arrows in FIG. 7. The source/drain regions thermally activated, either in a conventional furnace at a temperature between 550° C. and 650° C., or as shown in FIG. 8 using solid-state laser irradiation 801. In the embodiment of FIG. 8 the laser radiation 801 is a mixture of second and third harmonics of a 1064 nm Nd-Yag solid state laser as described above with reference to FIG. 5 with a pulse of about 100 mJ/cm². It will be understood therefore that steps of reducing crystal defects as described in FIG. 5, and the activation of the source/drain regions as shown in FIG. 8 may therefore be combined into a single step.

Figure 9:
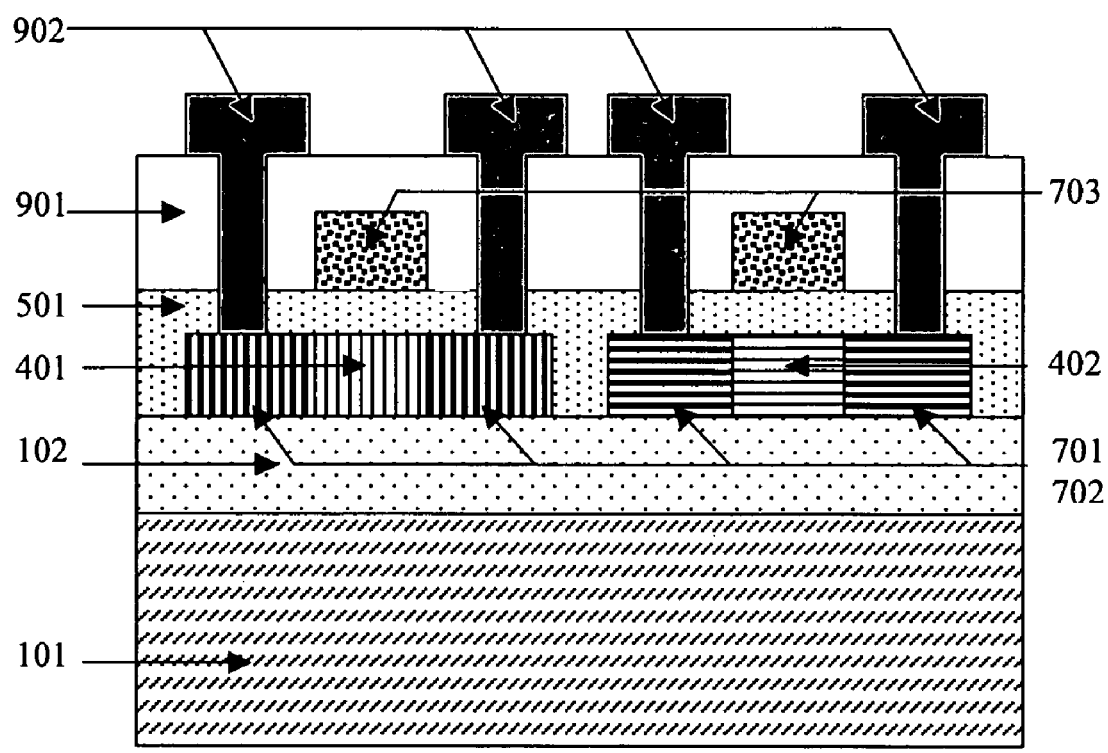
FIG. 9 shows a schematic cross-section of a polycrystalline silicon thin film transistor formed by metal-induce crystallization and solid state laser annealing techniques according to an embodiment of the invention.

Finally, as shown in FIG. 9 two thin-film transistors are shown in the schematic cross-section. An insulator 901 is deposited to cover the islands 401,402 and insulator layer 501. Contact holes are opened to the gate, source and drain electrodes and metal interconnects 902 are deposited and patterned.

Semiconductor devices manufactured in accordance with the present invention have a wide range of potential applications, including for example in temperature sensors, micro-mechanical structures, photo-detectors, infra-red sensors, electro-optic electrodes for use in displays, as thin film transistors for use, for example, in active-matrix back planes and peripheral driver circuits for flat panel displays, image sensors.

We claim that:

1. A method of forming polycrystalline silicon comprising the steps of:
   (a) forming a layer of amorphous silicon,
   (b) forming a layer of metal or metal-containing compound on said layer of amorphous silicon,
   (c) annealing said layer of amorphous silicon and said layer of metal to form a polycrystalline silicon layer, and
   (d) irradiating the polycrystalline silicon layer with two different harmonics of a pulsed laser.

2. A method as claimed in claim 1 wherein the polycrystalline silicon layer is irradiated with the two harmonics simultaneously in a single pulse.

3. A method as claimed in claim 2 wherein said pulse has a duration of from 1 ns to 10 ms.

4. A method as claimed in claim 2 wherein the pulse has a power of from 30-300 mj/cm².

5. A method as claimed in claim 1 wherein the polycrystalline silicon layer is irradiated with the two harmonics sequentially.

6. A method as claimed in claim 1 wherein the two harmonics are the second and third harmonics of a pulsed laser having an emission wavelength of between 0.9 and 1.2 microns.

7. A method as claimed in claim 1 wherein said laser is a solid-state laser.

8. A method as claimed in claim 1 wherein said laser is a Nd-Yag laser.

9. A method as claimed in claim 1 wherein said laser is a Nd-glass laser.

10. A method as claimed in claim 1 wherein said laser is an Alexandrite laser.

11. A method as claimed in claim 1 wherein said metal is nickel.

12. A method as claimed in claim 1 wherein said annealing of said amorphous silicon layer and said metal or metal-containing layer is carried out at a temperature of from 400 to 650° C. for a duration of from 0.5 to 5 hours.

13. A method of fabricating a semiconductor device comprising:
   (a) forming a layer of amorphous silicon on a substrate,
   (b) forming a layer of metal or metal-containing compound on said layer of amorphous silicon,
   (c) annealing said layer of amorphous silicon and said layer of metal to form a polycrystalline silicon layer, and
   (d) irradiating the polycrystalline silicon layer with two different harmonics of a pulsed laser.

14. A method as claimed in claim 13 wherein said polycrystalline layer is patterned prior to said laser irradiation.

15. A method as claimed in claim 13 wherein said polycrystalline layer is doped in selected regions and said laser irradiation serves to activate said doped regions.

16. A method as claimed in claim 13 wherein the polycrystalline silicon layer is irradiated with the two harmonics simultaneously in a single pulse.

17. A method as claimed in claim 16 wherein said pulse has a duration of from 5 to 30 ns.

18. A method as claimed in claim 16 wherein the pulse has a power of from 30-300 mj/cm².

19. A method as claimed in claim 13 wherein the polycrystalline silicon layer is irradiated with the two harmonics sequentially.

20. A method as claimed in claim 13 wherein the two harmonics are the second and third harmonics of a pulsed laser having an emission wavelength of between 0.9 and 1.2 microns.

21. A method as claimed in claim 13 wherein said laser is a solid-state laser.

22. A method as claimed in claim 13 wherein said laser is a Nd-Yag laser.

23. A method as claimed in claim 13 wherein said laser is a Nd-glass laser.

24. A method as claimed in claim 13 wherein said laser is an Alexandrite laser.

25. A method as claimed in claim 13 wherein said metal is nickel.

26. A method as claimed in claim 12 wherein said annealing of said amorphous silicon layer and said metal or metal-containing layer is carried out at a temperature of from 400 to 650° C. for a duration of from 0.5 to 5 hours.

* * * * *